(12) United States Patent
Weng et al.

(10) Patent No.: US 10,598,776 B2
(45) Date of Patent: Mar. 24, 2020

(54) METHOD FOR DETERMINING SAMPLING PHASE OF SAMPLING CLOCK SIGNAL AND ASSOCIATED ELECTRONIC DEVICE

(71) Applicant: MStar Semiconductor, Inc., Hsinchu Hsien (TW)

(72) Inventors: Ming-Han Weng, Hsinchu County (TW); Wei-Yung Wang, Hsinchu County (TW); Chih-Hung Lin, Hsinchu County (TW); Jyun Yang Shih, Hsinchu County (TW); Chun-Chia Chen, Hsinchu County (TW)

(73) Assignee: MEDIATEK INC., Hsinchu (TW)

( * ) Notice: Subject to any disclaimer, the term of this patent is extended or adjusted under 35 U.S.C. 154(b) by 229 days.

(21) Appl. No.: 15/639,049

(22) Filed: Jun. 30, 2017

(65) Prior Publication Data

US 2018/0188364 A1 Jul. 5, 2018

(30) Foreign Application Priority Data

Jan. 4, 2017 (TW) .............................. 106100102 A

(51) Int. Cl.
*H03K 5/135* (2006.01)
*H03K 5/151* (2006.01)
(Continued)

(52) U.S. Cl.
CPC ............ *G01S 13/288* (2013.01); *H03K 5/135* (2013.01); *H03K 5/151* (2013.01); *H03L 7/0805* (2013.01);
(Continued)

(58) Field of Classification Search
CPC ..... H03L 7/00; H03L 7/06; H03L 7/08; H03L 7/0805; H03L 7/081; H03L 7/0812; G01S 13/00; G01S 13/02; G01S 13/06; G01S 13/10; G01S 13/26; G01S 13/28; G01S 13/284; G01S 13/288; H03K 5/00; H03K 5/13; H03K 5/135; H03K 5/15;
(Continued)

(56) References Cited

U.S. PATENT DOCUMENTS

| | | | |
|---|---|---|---|
| 4,821,297 A | 4/1989 | Bergmann et al. | |
| 7,167,533 B2 | 1/2007 | Glenn et al. | |
| 7,474,714 B2 * | 1/2009 | Abhayagunawardhana | ................ H04L 7/033 375/326 |

* cited by examiner

*Primary Examiner* — Lincoln D Donovan
*Assistant Examiner* — Diana J. Cheng
(74) *Attorney, Agent, or Firm* — McClure, Qualey & Rodack, LLP

(57) ABSTRACT

An electronic device includes a clock generating circuit, a receiving circuit and a training circuit. The clock generating circuit generates a sampling clock signal, a phase-early sampling clock signal and a phase-late sampling clock signal. The receiving circuit samples received data according to the sampling clock signal, the phase-early sampling clock signal and the phase-late sampling clock signal to generate a sample result. The training circuit controls the clock generating circuit to generate the sampling clock signal and the corresponding phase-early sampling clock signal and phase-late sampling clock signal that have different phases in a plurality of different time intervals, respectively, to cause the receiving circuit to generate a plurality of sample results. The training circuit further determines a sampling phase of the sampling clock signal according to the sample results.

15 Claims, 7 Drawing Sheets

(51) Int. Cl.
*H03L 7/08* (2006.01)
*H03L 7/091* (2006.01)
*G01S 13/28* (2006.01)
*H04N 7/18* (2006.01)
*G11C 7/22* (2006.01)

(52) U.S. Cl.
CPC ............ *H03L 7/0807* (2013.01); *H03L 7/091* (2013.01); *H04N 7/188* (2013.01); *G11C 7/222* (2013.01)

(58) Field of Classification Search
CPC ........ H03K 5/151; H03K 5/1515; G11C 5/00; G11C 5/22; G11C 5/222
See application file for complete search history.

E : phase too early
X : phase correct
L : phase too late

··· E E E X X X X X X L L E E ···
              ↑
        optimum phase

FIG. 3

METHOD FOR DETERMINING SAMPLING PHASE OF SAMPLING CLOCK SIGNAL AND ASSOCIATED ELECTRONIC DEVICE

This application claims the benefit of Taiwan application Serial No. 106100102, filed Jan. 4, 2017, the subject matter of which is incorporated herein by reference.

BACKGROUND OF THE INVENTION

Field of the Invention

The invention relates in general to a receiver of an electronic device, and more particularly to a method for determining a sampling phase of sampling clock signal and an associated electronic device.

Description of the Related Art

In a conventional receiver, to determine a sampling phase of a sampling clock signal and hence ensure the stability and accuracy of a sample result, the receiver uses multiple sampling clock signals having different phases to sample a reception signal to generate multiple sample results, accordingly determines the sampling phase of the sampling clock signal, and subsequently samples the reception signal according to the sampling clock signal having the sampling phase. However, the sampling clock signals having different phases are usually in a plural quantity, e.g., 30 to 40. Thus, the receiver needs to be provided with 30 to 40 sampling circuits to perform the above operation, leading to increased chip area and production costs.

SUMMARY OF THE INVENTION

The invention is directed to a method for determining an optimum phase of a sampling clock signal and an associated electronic device to solve the above issues.

According to an embodiment of the present invention, an electronic device includes a clock generating circuit, a receiving circuit and a training circuit. The clock generating circuit generates a sampling clock signal, a phase-early sampling clock signal and a phase-late sampling clock signal that have a same frequency but different phases. Between the sampling clock signal and the phase-early sampling clock signal is a first phase difference; between the sampling clock signal and the phase-late sampling clock signal is a second phase difference. The receiving circuit samples received data according to the sampling clock signal, the phase-early sampling clock signal and the phase-late sampling clock signal to generate a sample result. The training circuit controls the clock generating circuit to generate the sampling clock and the corresponding phase-early sampling clock signal and phase-late sampling clock signal that have different phases in a plurality of different time intervals, respectively, to cause the receiving circuit to generate a plurality of sample results respectively corresponding to the time intervals. The training circuit further determines a sampling phase of the sampling clock according to the sample results that the receiving circuit generates in the time intervals.

According to another embodiment of the present invention, a method for determining an optimum phase of a sampling clock signal includes: a) generating a sampling clock, a phase-early sampling clock signal and a phase-late sampling clock signal that have a same frequency but different phases, wherein between the sampling clock signal and the phase-early sampling clock signal is a first phase difference, and between the sampling clock signal and the phase-late sampling clock signal is a second phase difference; b) sampling received data according to the sampling clock signal, the phase-early sampling clock signal and the phase-late sampling clock signal to generate a sample result; c) repeating steps (a) and (b) for a plurality of times to generate the clock sampling signal and the corresponding phase-early sampling clock signal and phase-late sampling clock signal that have different phases in a each of a plurality of time intervals, and accordingly generating the sample results respectively corresponding to the time intervals; and d) determining a sampling phase of the sampling clock signal according to the sample results generated in the time intervals.

The above and other aspects of the invention will become better understood with regard to the following detailed description of the preferred but non-limiting embodiments. The following description is made with reference to the accompanying drawings.

BRIEF DESCRIPTION OF THE DRAWINGS

FIG. 3 is a schematic diagram of determining a sampling phase of a sampling clock signal according to multiple determination results;

DETAILED DESCRIPTION OF THE INVENTION

Figure 1:
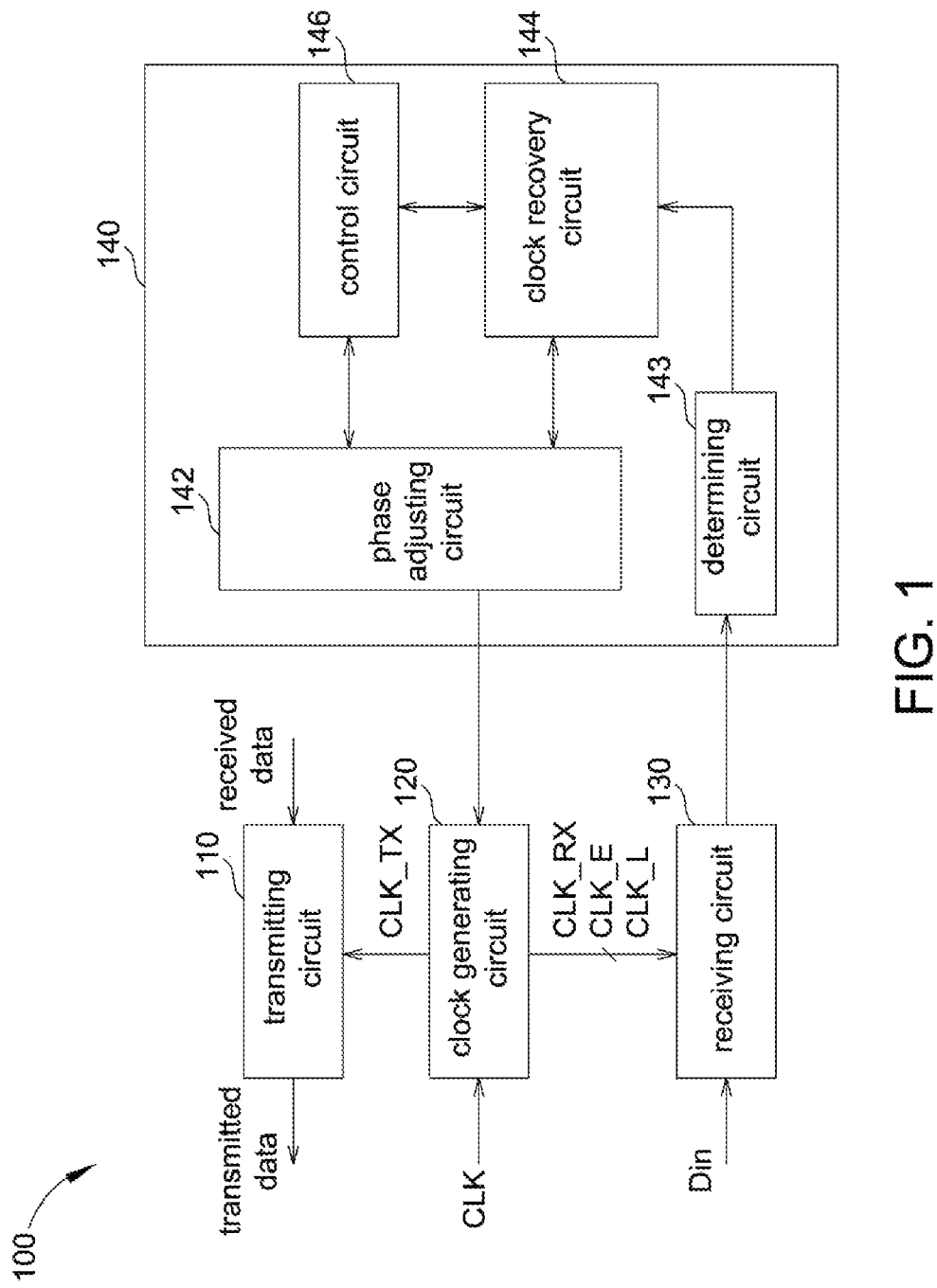
FIG. 1 is a block diagram of an electronic device according to an embodiment of the present invention.

FIG. 1 shows a block diagram of an electronic device 100 according to an embodiment of the present invention. As shown in FIG. 1, the electronic device 100 includes a transmitting circuit 110, a clock generating circuit 120, a receiving circuit 130 and a training circuit 140. In this embodiment, the electronic device 100 may be any electronic device that needs to transmit/receive data to/from another electronic device, e.g., an electronic device that read/writes from/to a smart card.

In the electronic device 100, the transmitting circuit 110 transmits data to another electronic device. The clock generating circuit 120 generates various clock signals for the use of the transmitting circuit 110 and the receiving circuit 130. For example, the clock generating circuit 120 generates a transmission clock signal CLK_TX to the transmitting circuit 110 for the transmitting circuit 110 to transmit transmitted data to another electronic device. The clock generating circuit 120 may also generate a sampling clock signal CLK_RX, a phase-early sampling clock signal CLK_E and a phase-late sampling clock signal CLK_L to the receiving circuit 130 for the receiving circuit 130 to sample received data Din. A sample result generated according to the sampling clock signal CLK_RX serves as official sample data, whereas sample results generated according to the phase-early sampling clock signal CLK_E and the phase-late sampling clock signal CLK_L are used for determining a sampling phase of the sampling clock signal CLK_RX in a training phase. Between the sampling clock signal CLK_RX and the phase-early sampling clock signal CLK_E is a first constant interval, and between the sampling clock signal CLK_RX and the phase-late sampling clock signal CLK_L is a second constant interval. The training circuit 140 determines the sampling phase of the sampling clock signal CLK_RX in the training phase, and includes a phase adjusting circuit 142, a determining circuit 143, a clock recovery circuit 144 and a control circuit 146. The phase adjusting circuit 142 controls the clock generating circuit 120 to generate multiple differently-phased sampling clock signals CLK_RX, phase-early sampling clock signals CLK_E and phase-late sampling clock signals CLK_L in different time intervals. Further, the phase adjusting circuit 142 may adjust sizes of the first and second constant intervals according to the control of the control circuit 146 and adjust the phase of the sampling clock signal CLK_RX according to the clock recovery circuit 144. The receiving circuit 130 generates multiple sample results according to the sampling clock signals CLK_RX, the phase-early sampling clock signals CLK_E and the phase-late sampling clock signals CLK_L. The determining circuit 143 generates multiple determination results according to the sample results. The clock recovery circuit 144 determines a sampling phase of the sampling clock signal CLK_RX according to the determination results and the phase of the current sampling clock signal CLK_RX that the phase adjusting circuit 142 returns, and transmits the sampling phase to the control circuit 146 for the purpose of sampling in a normal mode.

The electronic device 100 of the present invention is operable in a initial mode and a normal mode. The clock recovery circuit 144 may adjust the phase of the sampling clock signal CLK_RX in the initial mode and the normal mode. More specifically, the initial mode is a mode that the electronic device 100 adopts when it initially transmits data with another electronic device. In the initial mode, the clock generating circuit 120 generates the sampling clock signal CLK_RX having a initial phase, which is adjusted by the clock recovery circuit 144, and the initial mode is switched to the normal mode after the adjustment. The normal mode is a mode that the electronic device 100 adopts when it officially transmits data with another electronic device. In the normal mode, the clock recovery circuit 144 dynamically adjusts the phase of the sampling clock signal CLK_RX. Further, in the embodiment, although the same circuit (i.e., the clock recovery circuit 144) is applied to perform operations in the initial mode and the normal mode, the operations of the initial mode and the normal mode in another embodiment of the present invention may be performed by two different circuits. In other words, the clock recovery circuit 144 in FIG. 1 may be used only in the initial mode, whereas in another embodiment, the training circuit 140 further includes another clock recovery circuit that operates in the normal mode.

Figure 2:
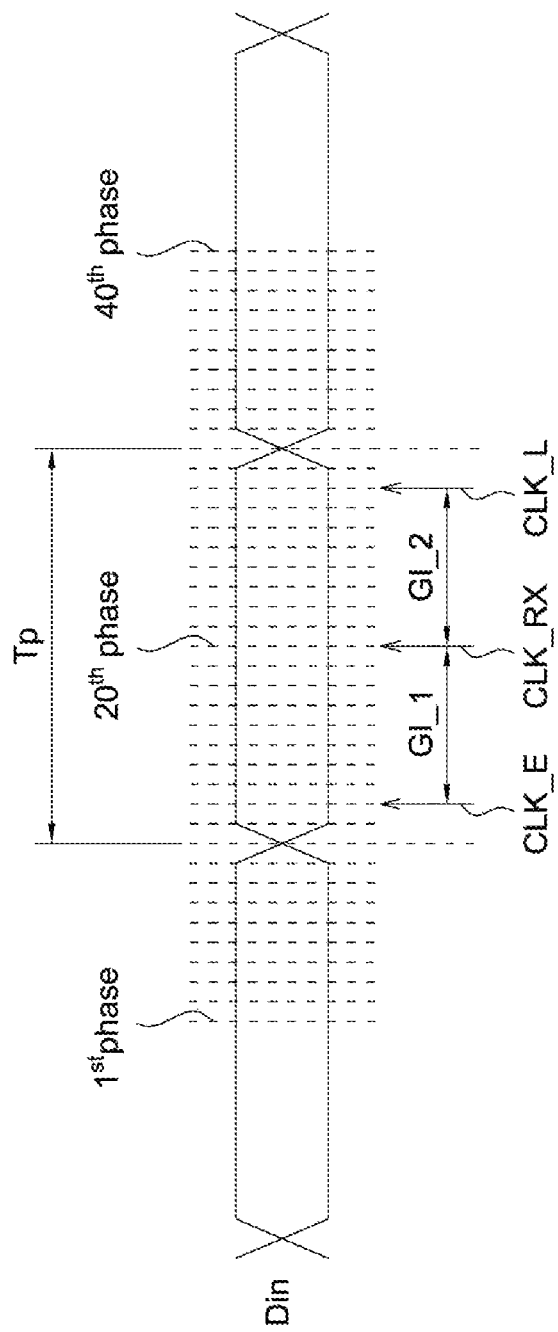
FIG. 2 is a schematic diagram of multiple differently-phased sampling clock signals, phase-early sampling clock signals and phase-late sampling clock signals that a clock generating circuit generates under the control of a training circuit 140 in FIG. 1 in a training phase.

FIG. 2 shows a schematic diagram of multiple sampling clock signals CLK_RX, phase-early sampling clock signals CLK_E and phase-late sampling clock signals CLK_L, which have different phases and are generated by the clock generating circuit 120 under the control of the training circuit 140 in FIG. 1 in different time intervals. As shown in FIG. 2, the control circuit 146 may adjust the clock generating circuit 120 in different time intervals through the phase adjusting circuit 142 to generate the sampling clock signal CLK_R and the corresponding phase-early sampling clock signal CLK_E and late-phase sampling clock signal CLK_L having different phases (40 different phases in this embodiment). Between the sampling clock signal CLK_RX and the corresponding phase-early sampling clock signal CLK_E is a first phase difference GI_1, and between the sampling clock signal CLK_RX and the corresponding phase-late sampling clock signal CLK_L is a second phase difference GI_2. In this embodiment, both of the first phase difference GI_1 and the second phase difference GI_2 are 8 units. However, the first phase difference GI_1 and the second phase difference GI_2 may be set as different phase differences. Further, Tp in FIG. 2 represents one period length of the received data Din. More specifically, the phase adjusting circuit 142 may first adjust the clock generating circuit 120 to generate a sampling clock signal CLK_RX_1 having a $1^{st}$ phase, to allow the receiving circuit 130 to use the sampling clock signal CLK_RX_1 and the corresponding phase-early sampling clock signal CLK_E_1 and phase-late sampling clock signal CLK_L_1 to sample the received data Din to obtain a $1^{st}$ set of sample results including three sample values. After one or multiple periods of the received data Din, the phase adjusting circuit 142 may adjust the clock generating circuit 120 to generate a sampling clock signal CLK_RX_2 having a $2^{nd}$ phase, to allow the receiving circuit 130 to use the sampling clock signal CLK_RX_2 and the corresponding phase-early sampling clock signal CLK_E_2 and phase-late sampling clock signal CLK_L_2 to sample the received data Din to obtain a $2^{nd}$ set of sample results including three sample values. Similarly, the phase adjusting circuit 142 sequentially adjusts the clock generating circuit 120 to cause the sampling clock signal CLK_RX to have $3^{rd}$ to $40^{th}$ phases, so as to allow the receiving circuit 130 to use the sampling clock signals CLK_RX having the $3^{rd}$ to $40^{th}$ phases and the corresponding phase-early sampling clock signals CLK_E and phase-late sampling clock signals CLK_L to sample different received data Din to obtain $3^{rd}$ to $40^{th}$ sets of sample results each including 3 sample values, respectively.

In this embodiment, the received data Din in each period (Tp) has a logic value, and the received data Din of multiple periods has alternating logic values "10101 . . . ". Each of the sets of sample results may be used to indicate whether the phase of the sampling clock signal CLK_RX is too early, too late or correct. More specifically, when the sample result indicates that the logic values of the sample results generated from sampling the received data Din according to the sampling clock signal CLK_RX and the phase-early sampling clock signal CLK_E are different, the determining circuit 143 may determine that the phase of the sampling clock signal CKL_RX is too early. When the sample result indicates that the logic values of the sample results generated from sampling the received data Din according to the sampling clock signal CLK_RX and the phase-late sampling clock signal CLK_L are different, the determining circuit 143 may determine that the phase of the sampling clock signal CKL_RX is too late. When the logic values of the sample results generated from sampling the received data Din according to the sampling clock signal CLK_RX, the phase-early sampling clock signal CLK_E and the phase-late sampling clock signal CLK_L are the same, the determining circuit 143 may determine that the phase of the sampling clock signal CLK_RX is correct. For example, when the thee sample values that the receiving circuit 130 generates according to the phase-early sampling clock signal CLK_E, the sampling clock signal CLK_RX and the phase-late sampling clock signal CLK_L are respectively (0, 1, 1) or (1, 0, 0), the determining circuit 143 may determine that the phase of the current sampling clock signal CLK_RX adopted is too early. Further, when the thee sample values are respectively (1, 1, 1) or (0, 0, 0), the determining circuit 143 may determined that the phase of the current sampling clock signal CLK_RX adopted is corrected. Further, when the thee sample values are respectively (0, 0, 1) or (1, 1, 0), the determining circuit 143 may determined that the phase of the current sampling clock signal CLK_RX adopted is too late.

Further, in another embodiment, when the logic values of the sample values generated from sampling the received data Din according to the sampling clock signal CLK_RX and the early-phase sampling clock signal CLK_E are different, and the logic values of the sample values generated from sampling the received data Din according to the sampling clock signal CLK_RX and the late-phase sampling clock signal CLK_L are also different, e.g., the three sample values that the receiving circuit 130 generates according to the phase-early sampling clock signal CLK_E, the sampling clock signal CLK_RX and the phase-late sampling clock signal CLK_L are respectively (0, 1, 0) or (1, 0, 1), it means that a sum of the first phase difference GI_1 and the second phase difference GI_2 in FIG. 2 is too large. At this point, the determining circuit 143 may control the phase adjusting circuit 142 through the control circuit 146 to reduce the first phase difference GI_1 and/or the second phase difference GI_2, and the foregoing determination process is then repeated.

FIG. 3 shows a schematic diagram of determining a sampling phase of the sampling clock signal CLK_RX according to multiple determination results. In FIG. 3, each letter represents one set of sample results—"E" represents that the phase of the sampling clock signal CLK_RX is too early, "X" represents that phase of the sampling clock signal CLK_RX is correct, and "L" represents that phase of the sampling clock signal CLK_RX is too late. As shown in FIG. 3, seven among the multiple sets of determination results indicate that the phase of the sampling clock signal CLK_RX is correct, and the clock recovery circuit 144 may determine the sampling phase of the sampling clock signal CLK_RX according to multiple successive determination results indicating that the phase of the sampling clock signal CLK_RX is correct. For example, in this embodiment, a median value of multiple phase values corresponding to the successive determination results indicating that the phase of the sampling clock signal CLK_RX is correct is used as the sampling phase of the sampling clock signal CLK_RX.

It should be noted that, the interval between every two of the $1^{st}$ to $40^{th}$ phases may be a constant value, and the clock recovery circuit 144 controls the clock adjusting circuit 120 to adjust one phase at a time. In one embodiment, the clock recovery circuit 144 may selectively control the direction for phase adjustment of the clock adjusting circuit 120, i.e., sequentially increasing the phase of the sampling clock signal CLK_RX or sequentially decreasing the phase of the sampling clock signal CLK_RX. In another embodiment, the clock recovery circuit 144 selectively controls the clock adjusting circuit 120 to adjust more than one phase at a time to accelerate the speed of clock recovery.

Figure 4:
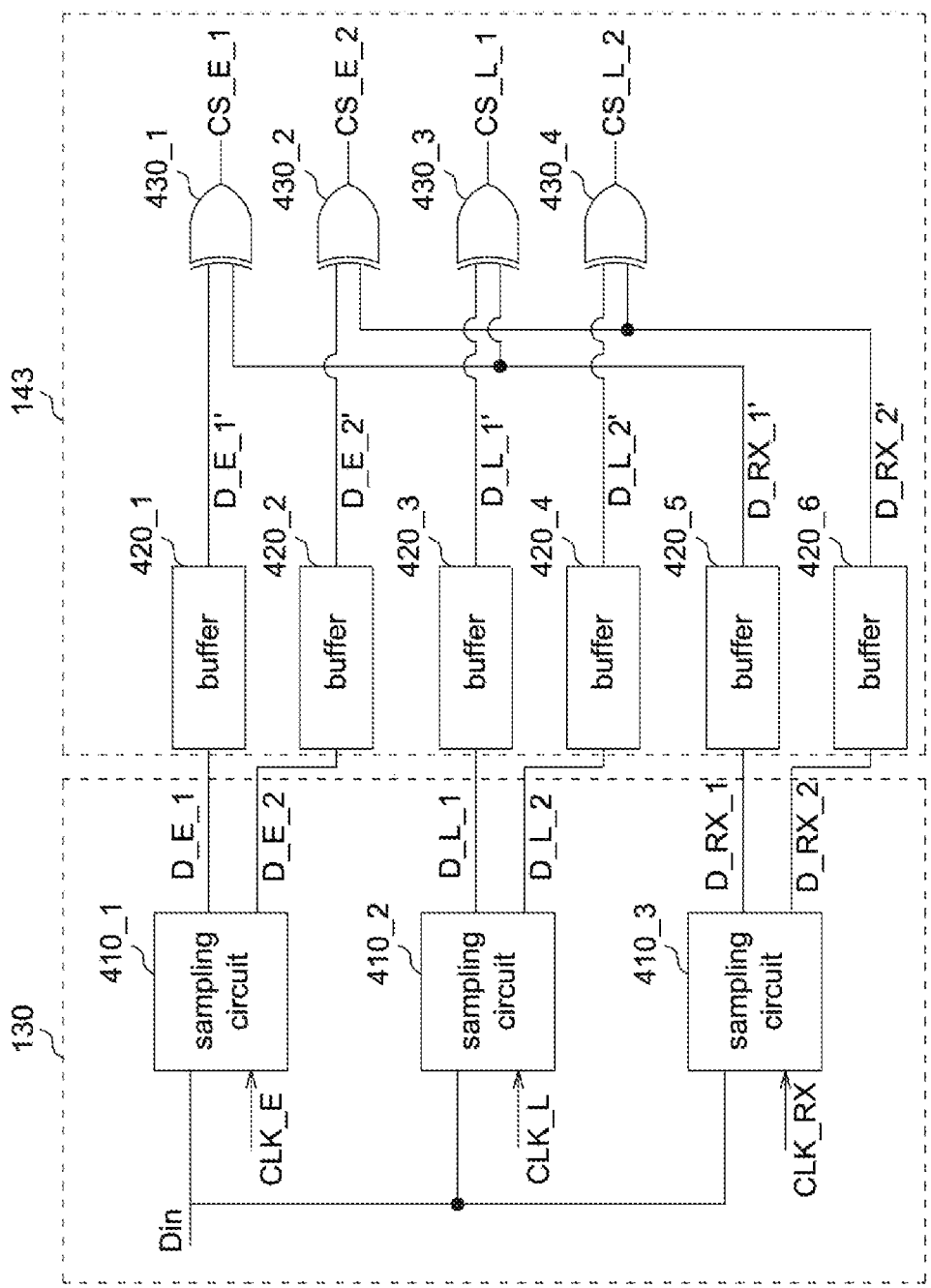
FIG. 4 is a detailed block diagram of a receiving circuit 130 according to an embodiment of the present invention.
Figure 5:
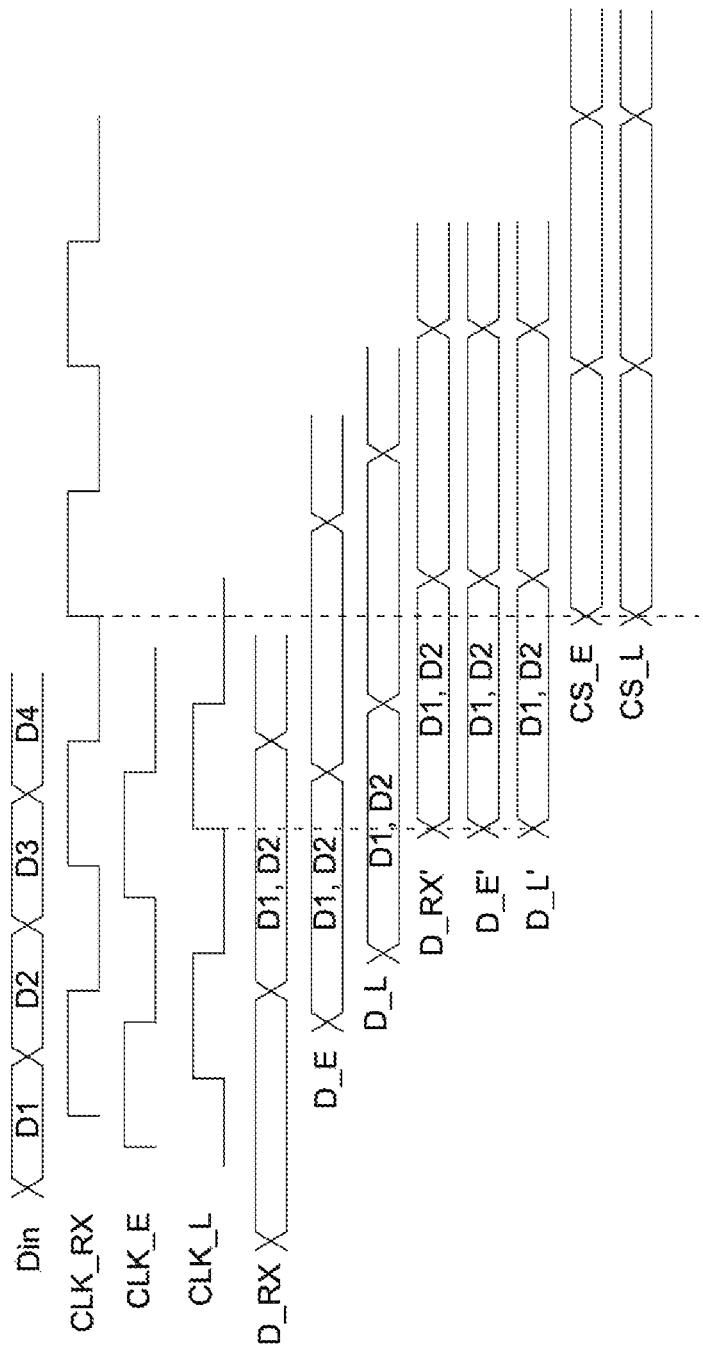
FIG. 5 is a timing diagram of signals in FIG. 4.

FIG. 4 shows a detailed block diagram of the receiving circuit 130 and the determining circuit 143 according to an embodiment of the present invention. FIG. 5 shows a timing diagram of FIG. 4. Referring to FIG. 4 and FIG. 5, the receiving circuit 130 includes three sampling circuits 410_1 to 410_3, and the determining circuit 143 includes six buffers 420_1 to 420_6 and four XOR gates 430_1 to 410_4. The sampling circuits 410_1 to 410_3 sample the received data Din according to the phase-early sampling clock signal CLK_E, the phase-late sampling clock signal CLK_L and the sampling clock signal CLK_RX to generate sample signals D_E, D_L and D_RX, respectively. In this embodiment, the sampling circuits 410_1 to 410_3 sample according to positive/negative edges, and thus sample data of two periods (e.g., D1 and D2 shown) of the received data Di, respectively, to generate sample signals D_E_1, D_E_2, D_L_1, D_L_2, D_RX_1 and D_RX_2 to the buffers 420_1 to 420_6, respectively. Wherein, the sample signals D_E_1, D_L_1 and D_RX_1 are results sampled at the positive edges, and the sample signals D_E_2, D_L_2 and D_RX_2 are results sampled at the negative edges. In another embodiment of the present invention, the sampling circuits 410_1 to 410_3 may sample according to only positive edges or only negative edges, and simultaneously store the sample results to two corresponding buffers. Next, the buffers 420_1 to 420_6 are triggered by a clock signal to simultaneously transmit buffered sampled signals D_E_1', D_E_2', D_L_1', D_L_2', D_RX_1' and D_RX_2' to the XOR gates 430_1 to 430_4. The XOR gate 430_1 performs an XOR operation on the buffered sample signals D_E_1' and D_RX_1' to generate a phase-early calculation result CS_E_1, the XOR gate 430_2 performs an XOR operation on the buffered sample signals D_E_2' and D_RX_2' to generate another phase-early calculation result CS_E2, the XOR gate 430_3 performs an XOR operation on the buffered sample signals D_L_1' and D_RX_1' to generate a phase-late calculation result CS_L_1, and the XOR gate 430_4 performs an XOR operation on the buffered sample signals D_L_2' and D_RX_2' to generate another phase-late calculation result CL_L2.

The phase-early calculation results CS_E_1 and CS_E_2 generated in the embodiment in FIG. 4 and FIG. 5 may serve as basis for the determining circuit 143 to determine whether the phase of the sampling clock signal CLK_RX is too early. That is, given that the logic values of the phase-early calculation results CS_E_1 and CS_E_2 are "1", it may be determined that the sampling clock signals CLK_RX is too early. Similarly, the phase-late calculation results CS_L_1 and CS_L_2 may serve as basis for determining whether the phase of the sampling clock signal CLK_RX is too late. That is, given that the logic values of the phase-late calculation results CS_L_1 and CS_L_2 are "1", it may be determined that the phase of the sampling clock signal CLK_RX is too late. Similarly, if the logic values of the phase-early calculation results CS_E_1 and CS_E_2 and the phase-late calculation results CS_L_1 and CS_L_2 are "0", it may be determined that the phase of the sampling clock signal CLK_RX is correct.

In one embodiment, the determining circuit 143 may continuously generate multiple sets of the phase-early calculation results CS_E_1 and CS_E_2 and the phase-late calculation results CS_L_1 and CS_L_2, so that higher accuracy is provided when the phase of the sampling clock signal CLK_RX is later determined.

The buffers 420_1 to 420_6 in FIG. 4 are all disposed in the determining circuit 143, or may be disposed in the receiving circuit 130—such associated design modifications are to be encompassed within the scope of the present invention. Further, as shown in FIG. 4, as the receiving circuit 130 of the embodiment needs only a small number of sampling circuit (3 sampling circuits in this embodiment), the embodiment significantly reduces production costs compared to the prior art that uses 30 to 40 sampling circuits.

Figure 6:
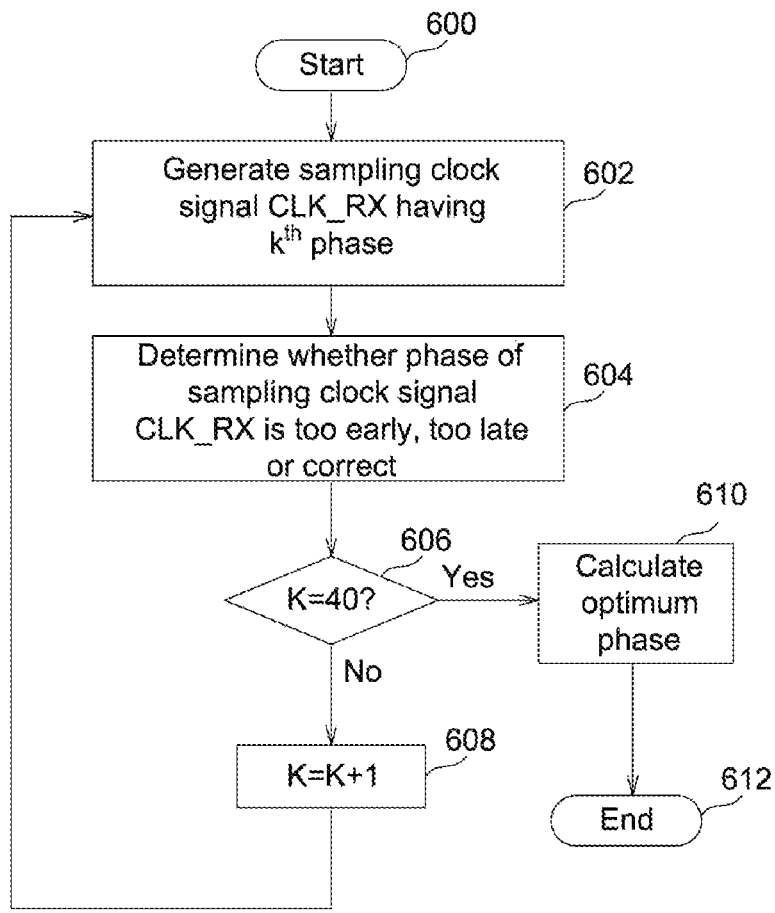
FIG. 6 is a flowchart of an electronic device determining a sampling phase of a sampling clock in a initial mode according to an embodiment of the present invention.

FIG. 6 shows a flowchart of the electronic device 100 determining the phase of the sampling clock signal CLK_RX in the initial mode according to an embodiment of the present invention. Referring to FIG. 6, the process begins in step 600. In step 602, the clock recovery circuit 144 controls the clock generating circuit 120 through the control circuit 146 and the phase adjusting circuit 142 to generate the sampling clock signal CLK_RX having a $K^{th}$ phase and the corresponding phase-early sampling clock signal CLK_E and phase-late sampling clock signal CLK_L, where K is any appropriate value, e.g., K=1. In step 604, the receiving circuit 130 samples the received data Din to generate a sample result (including three sample values), and the determining circuit 143 determines whether the phase of the sampling clock signal CLK_RX having the $K^{th}$ phase is too early, too late or correct, and transmits the determination result to the clock recovery circuit 144. In step 606, it is determined whether the value K is greater than a maximum value of the adjustable phase. In this embodiment, it is determined whether K is equal to 40. Step 608 is performed when K is not equal to 40, otherwise step 610 is performed when K is equal to 40. In step 608, the clock recovery circuit 144 controls the phase adjusting circuit 142 to increase the value of K by "1", and step 602 is iterated to control the clock generating circuit 120 to generate the sampling clock signal CLK_RX having the $(K+1)^{th}$ phase. In step 610, the clock recovery circuit 144 determines the sampling phase of the sampling clock signal CLK_RX according to the multiple sample results generated in the above process. The approach for calculating the sampling phase may be referred from the embodiment in FIG. 3, and the control circuit 146 later controls the clock generating circuit 120 through the phase adjusting circuit 142 according to the sampling phase to generate the sampling clock signal CLK_RX having this sampling phase for the receiving circuit 130 to subsequently sample the received data. The process ends in step 612.

Figure 7:
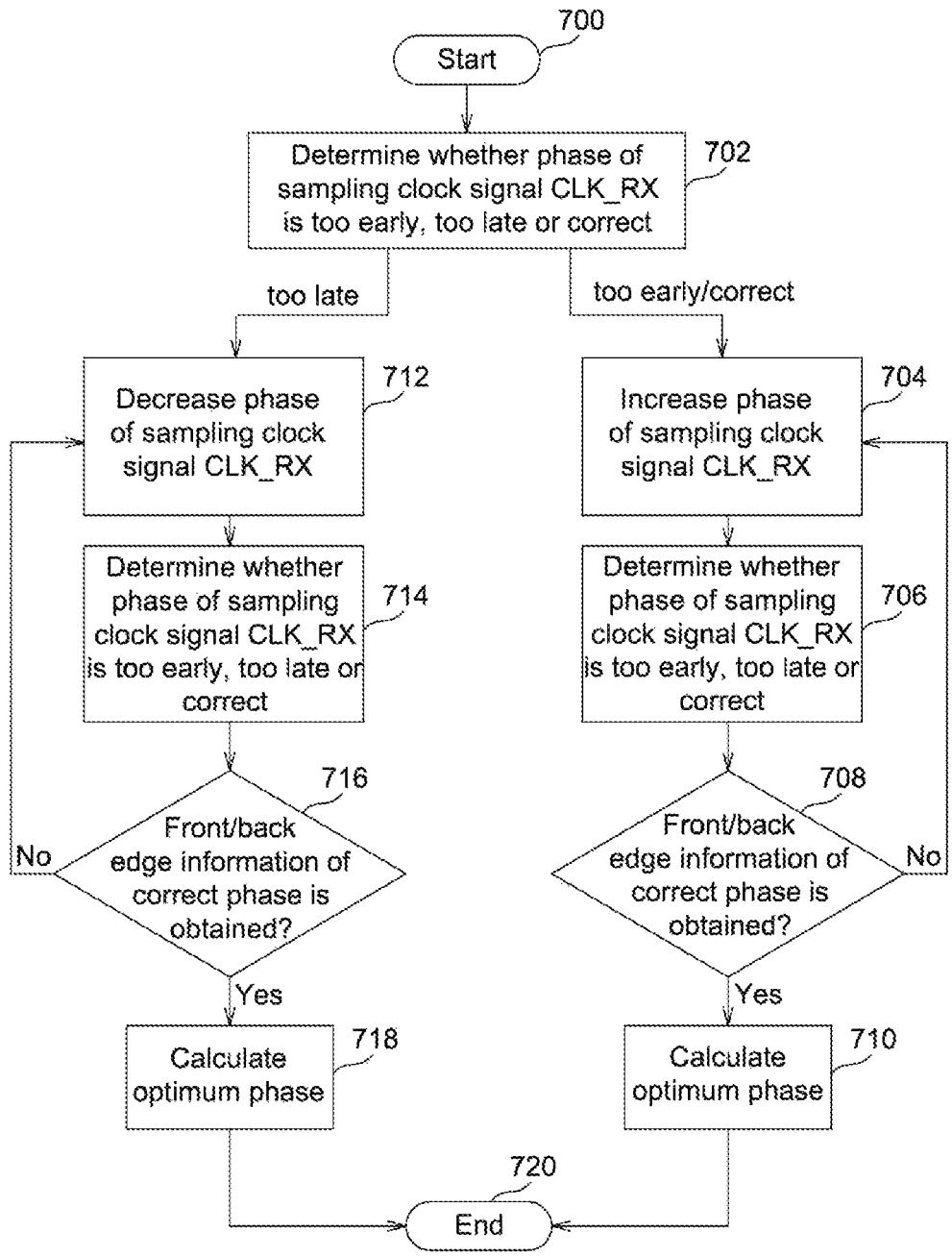
FIG. 7 is a flowchart of an electronic device determining a sampling phase of a sampling clock in a normal mode according to an embodiment of the present invention.

FIG. 7 shows a flowchart of the electronic device 100 determining the sampling phase of the sampling clock signal CLK_RX in the normal mode. Referring to FIG. 7, the process begins in step 700. In step 702, the determining circuit 143 determines whether the phase of the current sampling clock signal CLK_RX is too early, too late or correct according to the sampling clock signal CLK_RX, the phase-early sampling clock signal CLK_E and the phase-late sampling clock signal CLK_L. Step 704 is performed when the phase of the current sampling clock signal CLK_RX is too early or correct, or step 712 is performed when the phase of the current sampling clock signal CLK_RX is too late. In step 704, the clock recovery circuit 144 controls the clock generating circuit 120 through the phase adjusting circuit 142 to increase the phase of the sampling clock signal CLK_RX, e.g., adjusting from the $10^{th}$ phase to the $11^{th}$ phase. Wherein, the phase value increased each time is (1/N) of the period of the sampling clock signal, where N is a positive integer. In step 706, the receiving circuit 130 samples the received data Din to generate a sample result, and the determining circuit 143 determines whether the phase of the sampling clock signal CLK_RX is too early, too late or correct according to the sample result, and transmits the determination result to the clock recovery circuit 144. In step 708, the clock recovery circuit 144 determines whether information of front and back edges of the correct phase is obtained. For example, it is determined whether the phases corresponding to the front and back edges of the successive "X's" in FIG. 3 are obtained. Step 704 is iterated if not to continue increasing the phase of the sampling clock signal CLK_RX, otherwise step 710 is performed. In step 710, the clock recovery circuit 144 determines the sampling phase of the sampling clock signal CLK_RX according to the multiple sample results generated in the above process and transmits the sampling phase to the control circuit 146. Later, the control circuit 146 controls the clock generating circuit 120 through the phase adjusting circuit 142 to generate the sampling clock signal CLK_RX having this sampling phase for the receiving circuit 130 to subsequently sample the received data.

Similarly, in step 712, the clock recovery circuit 144 controls the clock generating circuit 120 through the phase adjusting circuit 142 to decrease the phase of the sampling clock signal CLK_RX, e.g., adjusting from the $10^{th}$ phase to the $9^{th}$ phase. The phase value decreased each time is (1/N) of the period of the sampling clock signal, where N is a positive integer. In step 714, the receiving circuit 130 samples the received data Din to generate a sample result, and the determining circuit 143 determines whether the phase of the sampling clock signal CLK_RX is too early, too late or correct, according to the sample result and transmits the determination result to the clock recovery circuit 144. Step 716 is similar to step 708; that is, if the clock recovery circuit 144 determines that the phases corresponding to the front and back edges of the successive "X's" in FIG. 3 are not yet obtained, step 712 is iterated, otherwise step 718 is performed. Step 718 is similar to 710, and associated details shall be omitted herein. The process ends in step 720.

In conclusion, in the method for determining a sampling phase of a sampling clock signal and the associated electronic device of the present invention, the receiving circuit needs only a small number of sampling circuits to obtain a sampling clock signal having a correct sampling phase. Thus, while sampling quality is ensured, a chip area and production costs may be reduced. Further, in a normal mode, when the clock recovery circuit dynamically adjusts the phase of the sampling clock signal CLK_RX, because the sampling performed according to the phase-early sampling clock signal CLK_E or the phase-late sampling clock signal CLK_L reaches the front and back edges of the correct phase earlier than that according to the sampling clock signal CLK_RX while the phase is moved, it is ensured that the sampling performed according to the sampling clock signal CLK_RX at the same time point is capable of maintaining the accuracy.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:
1. An electronic device, comprising:
a clock generating circuit, generating a sampling clock signal, a phase-early sampling clock signal and a phase-late sampling clock signal that have a same frequency but different phases, wherein between the sampling clock signal and the phase-early sampling clock signal is a first difference and between the sampling clock signal and the phase-late sampling clock signal is a second phase difference;
a receiving circuit, sampling received data according to the sampling clock signal, the phase-early sampling clock signal and the phase-late sampling clock signal to generate a sample result; and a training circuit, controlling the clock generating circuit to generate the sampling clock signal and the corresponding phase-early sampling clock signal and phase-late sampling clock signal having different phases in each of a plurality of time intervals, to cause the receiving circuit to generate the sample result corresponding to each of the time intervals, the training circuit further determining a sampling phase of the sampling clock signal according to the respective sample results that the receiving circuit generates in the time intervals, wherein each of the sample results comprise three sample values respectively corresponding to the sampling clock signal, the phase-early sampling clock signal and the phase-late sampling clock signal, wherein the training circuit comprises a determining circuit, which determines whether the phase of the sampling clock signal corresponding to each of the sample results is too early, too late or correct according to the sample values comprised in each of the sample results.

2. The electronic device according to claim 1, wherein when the sample result indicates that logic values of the sample values generated from sampling the received data according to the sampling clock signal and the phase-early sampling clock signal are different, the determining circuit determines that the phase of the sampling clock signal is too early; when the sample result indicates that logic values of the sample values generated from sampling the received data according to the sampling clock signal and the phase-late sampling clock signal are different, the determining circuit determines that the phase of the sampling clock signal is too late; and when the sample result indicates that the logic values of the sample values generated from sampling the received data according to the sampling clock signal, the phase-early sampling clock signal and the phase-late sampling clock signal are the same, the determining circuit determines that the phase of the sampling clock signal is correct.

3. The electronic device according to claim 1, wherein when the sample result indicates that logic values of the sample values generated from sampling the received data according to the phase-early sampling clock signal and the phase-late sampling clock signal are the same and are different from a logic value of the sample value generated from sampling the received data according to the sampling clock signal, the determining circuit determines that a sum of the first phase difference and the second phase difference is too large.

4. The electronic device according to claim 3, wherein the training circuit further comprises a control circuit, which controls the clock generating circuit to adjust at least one of the first phase difference and the second phase differences to reduce the sum when the determining circuit determines that the sum is too large.

5. The electronic device according to claim 1, wherein the training circuit comprises a phase adjusting circuit, which controls the clock generating circuit to sequentially increase or decrease phase values of the sampling clock signal and the corresponding phase-early sampling clock signal and phase-late sampling clock signal in different time intervals, to cause the receiving circuit to generate a plurality of sample results in the different time intervals, and a phase value increased or decreased each time is (1/N) of a period of the sampling clock signal, where N is a positive integer.

6. The electronic device according to claim 5, wherein the training circuit further comprises a clock recovery circuit, and when the determining circuit determines that the phase of the sampling clock signal corresponding to a plurality of successive sample results is correct, the clock recovery circuit determines the sampling phase of the sampling clock signal according to the phase corresponding to the successive sample results.

7. The electronic device according to claim 6, wherein the training circuit determines the sampling phase of the sampling clock signal according to a median value of the plurality of phase values corresponding to a specific sample results of the successive sample results.

8. The electronic device according to claim 1, wherein the clock generating circuit generates the phase-early sampling clock signal according to the sampling clock signal and the first phase difference, and generates the phase-late sampling clock signal according to the sampling clock signal and the second phase difference.

9. A method for determining a sampling phase of a sampling clock signal, comprising:
   a) generating a sampling clock signal, a phase-early sampling clock signal and a phase-late sampling clock signal that have a same frequency but different phases, wherein between the sampling clock signal and the phase-early sampling clock signal is a first difference and between the sampling clock signal and the phase-late sampling clock signal is a second phase difference;
   b) sampling received data according to the sampling clock signal, the phase-early sampling clock signal and the phase-late sampling clock signal to generate a sample result;
   c) repeating steps (a) and (b) to generate the sampling clock signal and the corresponding phase-early sampling clock signal and phase-late sampling clock signal having different phases in each of a plurality of time intervals to generate the sample result corresponding to each of the time intervals;
   d) determining a sampling phase of the sampling clock signal according to the respective sample results generated in the time intervals, wherein each of the sample results in step (b) comprise three sample values respectively corresponding to the sampling clock signal, the phase-early sampling clock signal and the phase-late sampling clock signal; and
   determining whether the phase of the sampling clock signal corresponding to each of the sample results is too early, too late or correct according to the sample values comprised in each of the sample results by determining that a sum of the first phase difference and the second phase difference is too large when the sample result indicates that logic values of the sample values generated from sampling the received data according to the phase-early sampling clock signal and the phase-late sampling clock signal are the same and are different from a logic value of the sample value generated from sampling the received data according to the sampling clock signal.

10. The method according to claim 9, wherein the step of determining whether the phase of the sampling clock signal corresponding to each of the sample results is too early, too late or correct according to the sample values comprised in each of the sample results comprises: when the sample result indicates that logic values of the sample values generated from sampling the received data according to the sampling clock signal and the phase-early sampling clock signal are different, determining that the phase of the sampling clock signal is too early; when the sample result indicates that logic values of the sample values generated from sampling the received data according to the sampling clock signal and the phase-late sampling clock signal are different, determining that the phase of the sampling clock signal is too late; and when the sample result indicates that the logic values of the sample values generated from sampling the received data according to the sampling clock signal, the phase-early sampling clock signal and the phase-late sampling clock signal are the same, determining that the phase of the sampling clock signal is correct.

11. The method according to claim 9, further comprising: adjusting at least one of the first phase difference and the second phase differences to reduce the sum when it is determined that the sum is too large.

12. The method according to claim 9, wherein step (c) comprises: sequentially increasing or decreasing phase values of the sampling clock signal and the corresponding phase-early sampling clock signal and phase-late sampling clock signal in different time intervals to generate a plurality of sample results in the different time intervals; wherein, a phase value increased or decreased each time is (1/N) of a period of the sampling clock signal, where N is a positive integer.

13. The method according to claim 12, wherein step (d) comprises: when the phase of the sampling clock signal corresponding to a plurality of successive sample results is correct, determining the sampling phase of the sampling clock signal according to the phase corresponding to the successive sample results.

14. The method according to claim 13, wherein the step of determining the sampling phase of the sampling clock signal according to the phase corresponding to the successive sample results comprises: determining the sampling phase of the sampling clock signal according to a median value of the plurality of phase values corresponding to a specific sample results of the successive sample results.

15. The method according to claim 9, wherein step (a) comprises: generating the phase-early sampling clock signal according to the sampling clock signal and the first phase difference; and generating the phase-late sampling clock signal according to the sampling clock signal and the second phase difference.

* * * * *